(12) United States Patent
Ho et al.

(10) Patent No.: US 7,470,864 B2
(45) Date of Patent: Dec. 30, 2008

(54) MULTI-CONDUCTING THROUGH HOLE STRUCTURE

(75) Inventors: Kwun-Yao Ho, Hsin-Tien (TW); Moriss Kung, Hsin-Tien (TW); Chi-Hsing Hsu, Hsin-Tien (TW); Jimmy Hsu, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 419 days.

(21) Appl. No.: 11/231,219

(22) Filed: Sep. 19, 2005

(65) Prior Publication Data

US 2006/0012030 A1 Jan. 19, 2006

Related U.S. Application Data

(63) Continuation-in-part of application No. 11/065,496, filed on Feb. 23, 2005.

(51) Int. Cl.
 *H05K 1/11* (2006.01)
(52) U.S. Cl. .................. 174/262; 174/261; 174/263; 174/264; 174/265; 174/266; 361/792; 361/793; 361/794; 361/795
(58) Field of Classification Search .................. 174/262, 174/260, 263, 264, 265, 266
 See application file for complete search history.

(56) References Cited

U.S. PATENT DOCUMENTS 4,543,715 A * 10/1985 Iadarola et al. ............... 29/852
5,021,866 A * 6/1991 Sudo et al. .................. 257/736
6,040,524 A * 3/2000 Kobayashi et al. ........... 174/36
6,891,272 B1 * 5/2005 Fjelstad et al. ............. 257/774
6,992,255 B2 * 1/2006 Oprysko et al. ............ 174/262
2002/0074162 A1 * 6/2002 Su et al. .................... 174/262
2002/0179332 A1 * 12/2002 Uematsu et al. ............ 174/262
2005/0133251 A1 * 6/2005 Chiu ......................... 174/259
2006/0125573 A1 * 6/2006 Brunette et al. .............. 333/33
2006/0247482 A1 * 11/2006 Hope et al. ................. 585/521

* cited by examiner

*Primary Examiner*—Dean A. Reichard
*Assistant Examiner*—Hoa C Nguyen
(74) *Attorney, Agent, or Firm*—J.C. Patents

(57) ABSTRACT

A multi-conducting through hole structure is provided. The multi-conducting through hole structure has a substrate, at least two signal lines and at least a reference line. The substrate has a through hole passing therethrough. The signal lines are disposed on a portion of an inner surface of the through hole and extended through the through hole. The reference line is disposed on a portion of the inner surface of the through hole and extended through the through hole, wherein the reference line is disposed between the lines for signal. Because the signal lines are separated by the reference line, the electromagnetic coupling generated by signals can be reduced to lower the cross-talk interference between signals passing through the through hole, so as to promote the signal-transmission quality.

9 Claims, 5 Drawing Sheets

MULTI-CONDUCTING THROUGH HOLE STRUCTURE

CROSS-REFERENCE TO RELATED APPLICATION

This application is a continuation-in-part of a prior application Ser. No. 11/065,496, filed Feb. 23, 2005, which claims the priority benefit of Taiwan application serial no. 93105346, filed on Mar. 2, 2004. All disclosures are incorporated herewith by reference.

BACKGROUND OF THE INVENTION

1. Field of the Invention

The present invention generally relates to a signal transmission structure, in particular, the present invention relates to a multi-conducting through hole structure which can be used in a circuit board.

2. Description of Related Art

A conventional circuit board comprises multiple patterned circuit layers and a plurality of dielectric layers alternately laminated on top of each other. The patterned circuit layers are formed, for example, by patterning copper foils in a photolithographic process and an etching process. The dielectric layers are disposed between two neighboring patterned circuit layers to isolate the patterned circuit layers. In addition, the laminated circuit layers are electrically connected with each other through plated through holes (PTH) or micro vias.

The method of forming a micro via includes performing a photolithographic process or a laser drilling process to form a opening in the dielectric layer, and then filling the opening with a conductive material to form a micro via for electrically connecting at least two of the patterned circuit layers. The method of forming a PTH includes performing a mechanical drilling process to form a through hole in the laminated layers or a dielectric core layer, and then performing an electroplating process to form a metal layer on the inner surface of the through hole for electrically connecting two or more patterned circuit layers.

Since the conventional PTH occupies a larger area on a circuit board, the conventional PTH forms a limitation for raising the layout density of the circuit board. Therefore, a new type of multi-conducting PTH is developed. Compared with the conventional PTH having one conducting line passing through a single through hole, the new type of multi-conducting PTH has at least two conducting lines passing through a single through hole. Therefore, one new multi-conducting PTH is equal to a few of conventional PTHs, and the number of the conventional PTHs in the circuit board is decreased.

In order to form the new type of multi-conducting PTH in a circuit board, a laser cutting process can be added to the original processes of the conventional PTH. A metal layer on the inner surface of the through hole is cut by laser to form two or more segments or lines that vertically extending along the central axis of the through hole. Therefore, at least two metal lines are formed in the through hole, and the two pattern circuit layers located at the both ends of the lines formed of the metal layer respectively can electrically connected with each other by these metal lines.

There is still another method developed to form a multi-conducting PTH disclosed in application Ser. No. 11/065,496. The method can apply an additive process, a semi-additive process, or a negative process to form a plurality of metal lines (or strips) on the inner surface of the single through hole at the same time. The later method has higher speed and lower cost than those of the laser cutting process.

Since the layout density and the operating frequency of the circuit board are getting higher, the metal lines of the multi-conducting PTHs crowed inside the single through hole will raise heavy cross talk. Therefore, a proper arrangement of the multi-conducting PTH is very important.

SUMMARY OF THE INVENTION

An object of the present invention is to provide a multi-conducting through hole structure capable of reducing electromagnetic coupling between signals and lowering the cross-talk therefrom.

According to an objection of the present invention, a multi-conducting through hole structure comprises a substrate having a through hole which passes through the substrate; at least two signal lines disposed on a portion of an inner surface of the through hole and extended through the through hole; and a reference line disposed on a portion of the inner surface of the through hole of the substrate and extended through the through hole, wherein the reference line is disposed between two of the signal lines.

According to an objection of the present invention, a multi-conducting through hole structure comprises a substrate having a through hole which passes through the substrate; at least two signal lines disposed on a portion of an inner surface of the through hole and extended through the through hole; and at least two reference lines disposed on a portion of the inner surface of the through hole of the substrate and extended through the substrate, wherein two of the signal lines are separated via one of the reference lines.

According to an objection of the present invention, a multi-conducting through hole structure comprises a substrate having a first through hole and a second through hole those pass through the substrate; a first signal line disposed on a portion of inner surface of the first through hole and extended through the first through hole; a second signal line disposed on a portion of inner surface of the second through hole and extended through the second through hole; and a first reference line disposed on a portion of the inner surface of the first through hole and extended through the first through hole, wherein the first reference line is disposed between the first signal line and the second signal line.

In the present invention, because the reference line is disposed between the signal lines, the signal interference between the signal lines is shielded by the reference line. Therefore, the alternate capacitance and inductance derived from the electromagnetic coupling between the signals will be reduced so as to lower the cross-talk problem and to promote the signal-transmission quality.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

Figure 1A:
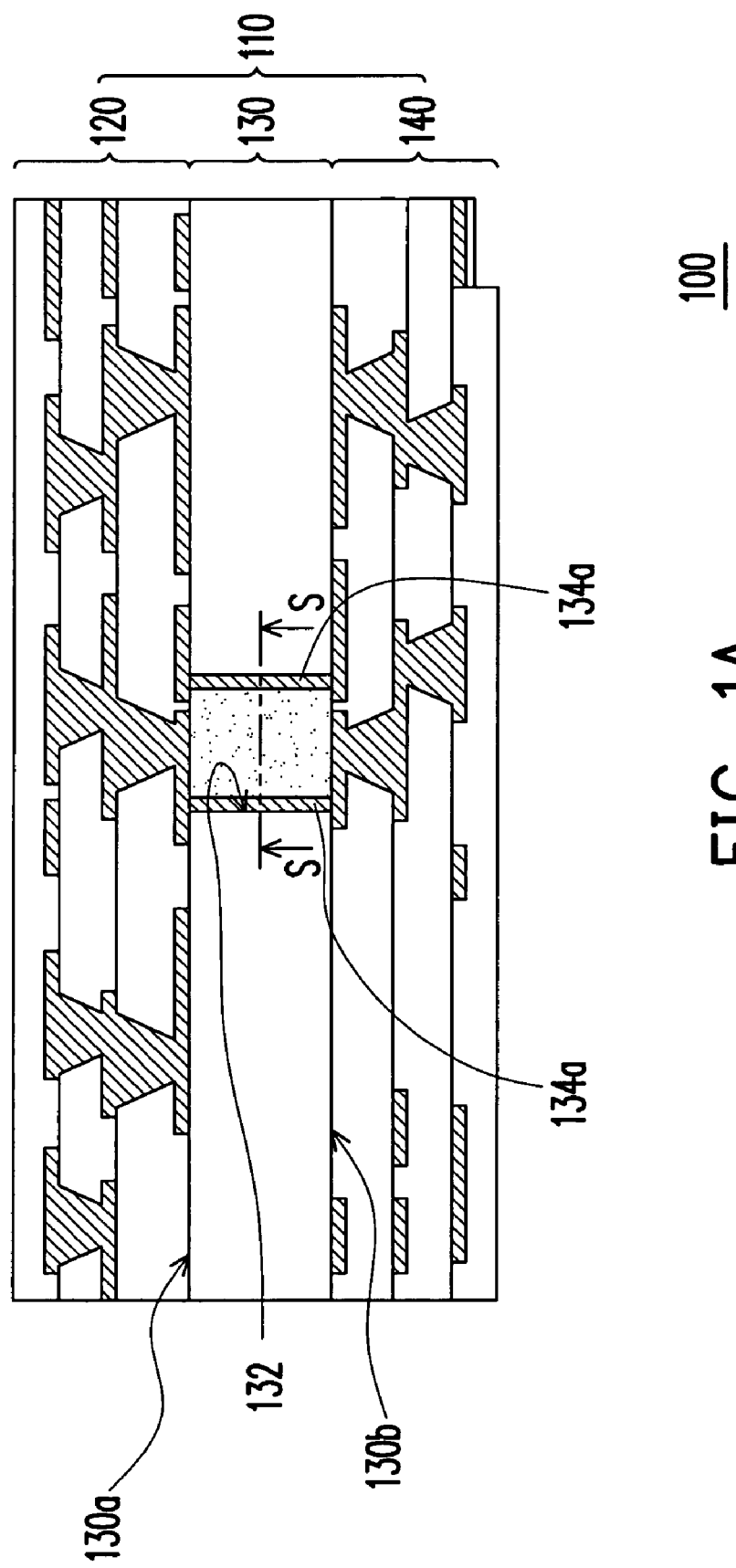
FIG. 1A is a vertical cross-sectional view of a multi-conducting through hole structure according to one embodiment of the present invention.
Figure 1B:
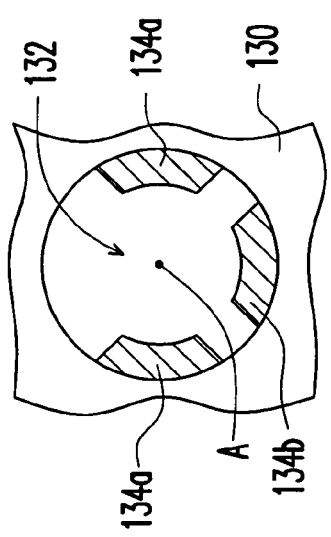
FIG. 1B is a horizontal cross-sectional view taken along line S-S in FIG. 1A.

FIG. 1A is a vertical cross-sectional view of a multi-conducting through hole structure according to one embodiment of the present invention. FIG. 1B is a horizontal cross-sectional view taken along line S-S in FIG. 1A. Referring to FIG. 1A and FIG. 1B, a circuit board 100, having altogether patterned circuit layers and dielectric layers is used as an example in FIG. 1A. The circuit board 100 has a multi-layer circuit structure 110 comprising a top circuit structure 120, a dielectric core layer 130 and a bottom circuit structure 140. The top circuit structure 120 comprises a plurality of patterned circuit layers and at least a dielectric layer alternately laminated over each other above the dielectric core layer 130. Similarly, the bottom circuit structure 140 comprises a plurality of patterned circuit layers and at least a dielectric layer alternately laminated over each other below the dielectric core layer 130.

In the aforementioned embodiment, although the through holes 132 passing through a single layer (dielectric core layer 130) is used as an example, the through holes 132 may pass through at least a dielectric layer and through a plurality of patterned circuit layers. In other words, the dielectric core layer 130 can be a substrate that is consisted of a single dielectric layer or a multiple layers comprising a plurality of patterned circuit layers and at least a dielectric layer disposed between the patterned circuit layers.

Further, the dielectric core layer 130 has a through holes 132 passing through the dielectric core layer 130 and linking a top surface 130a with a bottom surface 130b of the dielectric core layer 130. Two signal line 134a and one reference lines 134b (shown in FIG. 1B) are disposed on a portion of an inner surface of the through hole 132 and are extended through the through hole 132 to electrically connect the top circuit structure 120 with the bottom circuit structure 140. The signal lines 134a and the reference line 134b are arranged around a central axis A of the through hole 132, and the reference line 134b is disposed between the two signal lines 134a. The reference line 134b can be a ground line or a power line. Therefore, the electromagnetic coupling between the two signal lines 134a is reduced by the reference line 134b.

Figure 1C:
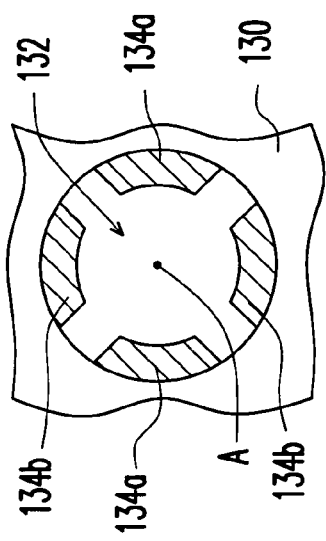
FIG. 1C is a horizontal cross-sectional view of a multi-conducting through hole structure according to another embodiment of the present invention.

FIG. 1C is a horizontal cross-sectional view of a multi-conducting through hole structure according to another embodiment of the present invention. Referring to FIG. 1C, comparing a multi-conducting through hole structure according to another embodiment of the present invention in FIG. 1C to the same in FIG. 1B, two signal line 134a and two reference lines 134b are disposed on a portion of an inner surface of the through hole 132 and are extended through the through hole 132. The signal lines 134a and the reference lines 134b are arranged around a central axis A of the through hole 132, and one of the reference lines 134b is disposed between neighbor two of the signal lines 134a. Similarly, each of the reference lines 134b can be a ground line or a power line. Therefore, the electromagnetic coupling between the three signal lines 134a is also reduced by the reference lines 134b.

Figure 1D:
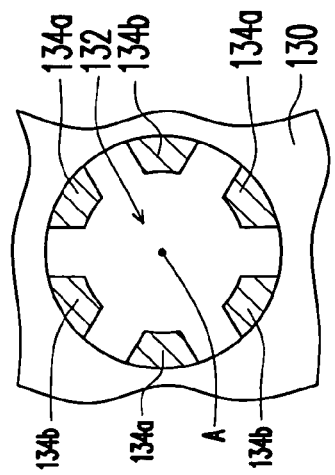
FIG. 1D is a horizontal cross-sectional view of a multi-conducting through hole structure according to another embodiment of the present invention.

FIG. 1D is a horizontal cross-sectional view of a multi-conducting through hole structure according to another embodiment of the present invention. Referring to FIG. 1D, comparing a multi-conducting through hole structure according to another embodiment of the present invention in FIG. 1D to the same in FIG. 1C, three signal line 134a and three reference lines 134b are disposed on a portion of an inner surface of the through hole 132 and are extended through the through hole 132. The signal lines 134a and the reference lines 134b are arranged around a central axis A of the through hole 132, and one of the reference lines 134b is disposed between neighbor two of the signal lines 134a. Similarly, each of the reference lines 134b can be a ground line or a power line. Therefore, the electromagnetic coupling between the three signal lines 134a is also reduced by the reference lines 134b.

Figure 2A:
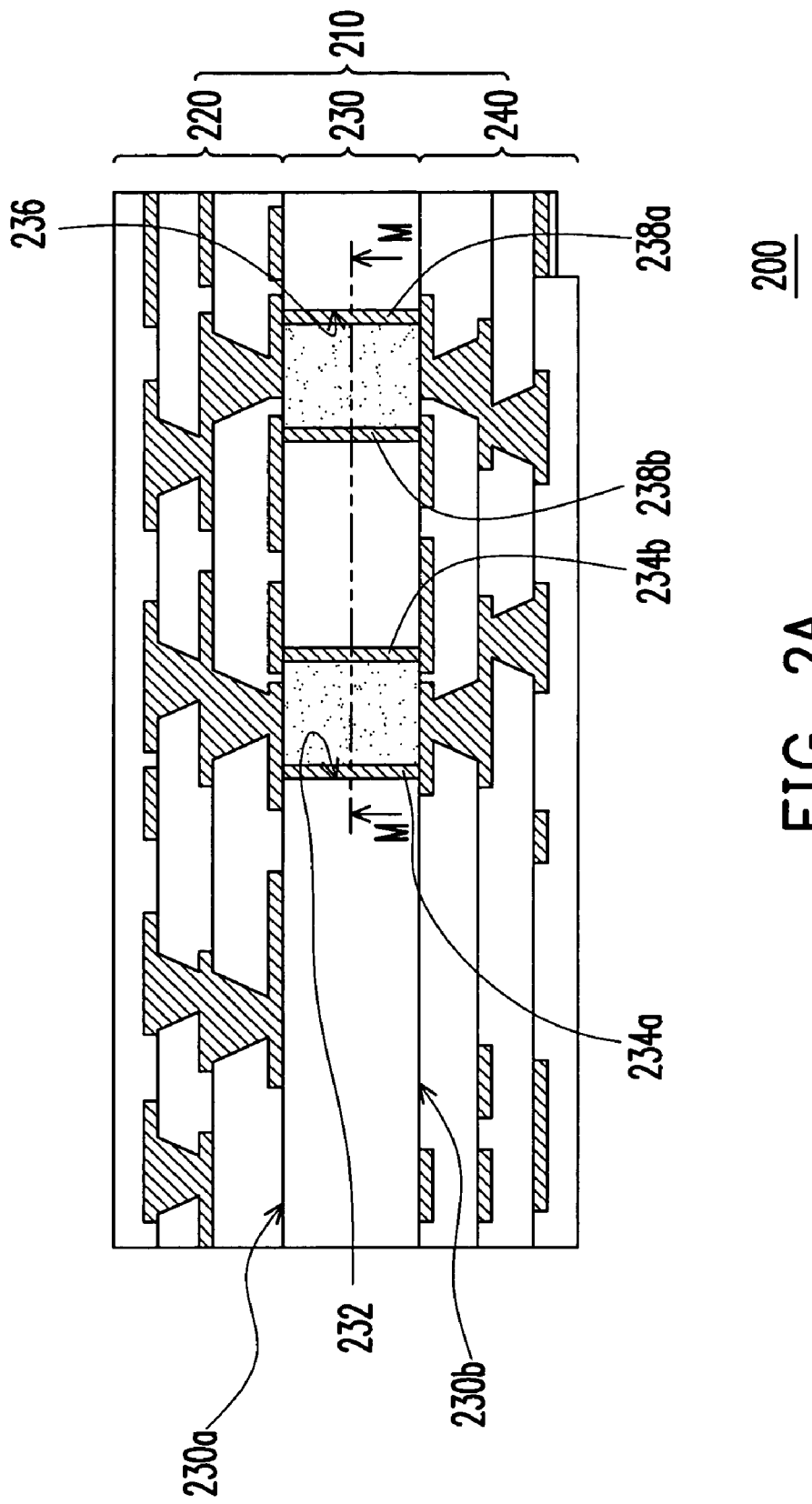
FIG. 2A is a vertical cross-sectional view of a multi-conducting through hole structure according to another embodiment of the present invention.
Figure 2B:
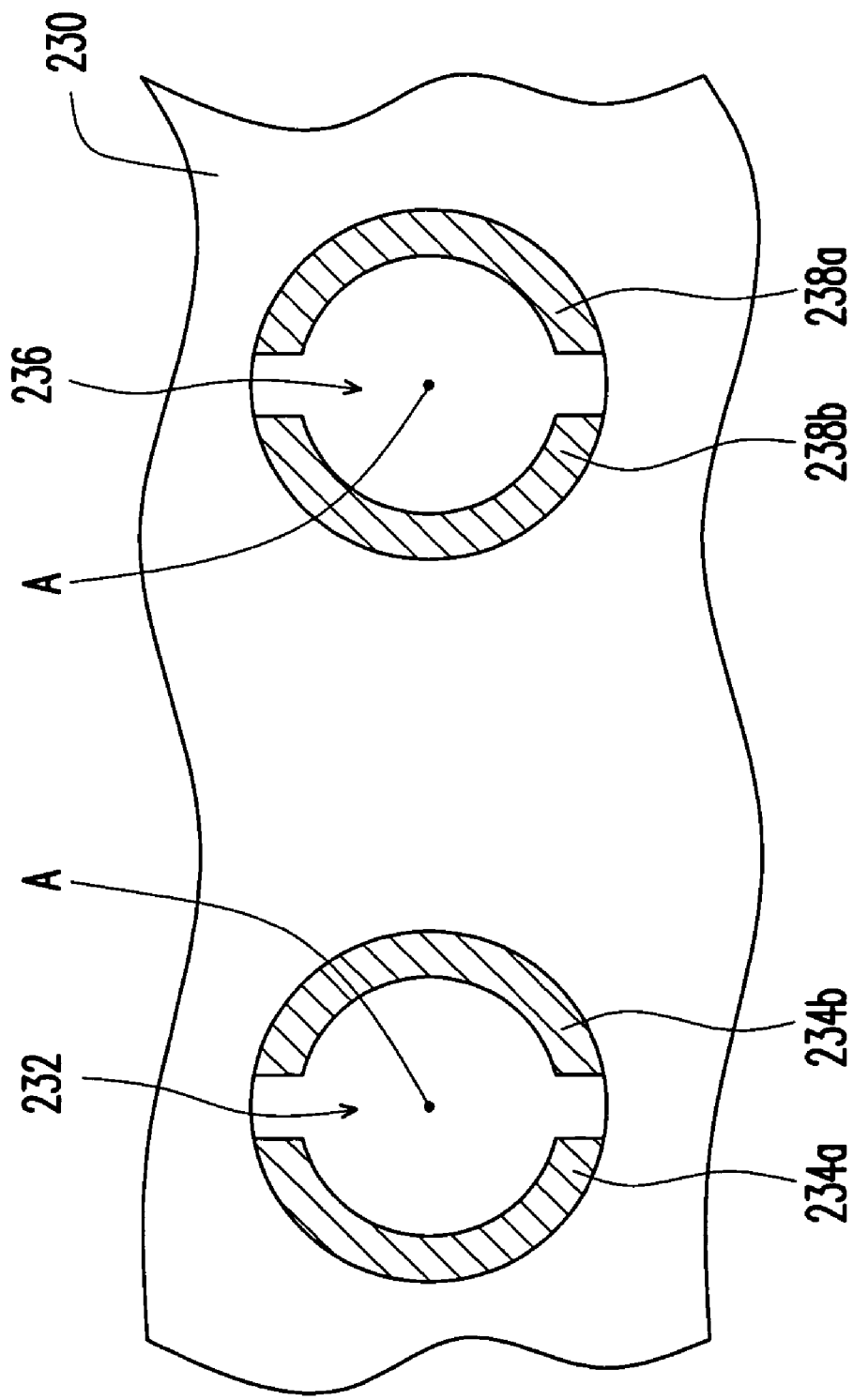
FIG. 2B is a horizontal cross-sectional view taken along line M-M in FIG. 2A.

FIG. 2A is a vertical cross-sectional view of a multi-conducting through hole structure in a circuit board according to another embodiment of the present invention. FIG. 2B is a horizontal cross-sectional view taken along line M-M in FIG. 2A. Referring to FIG. 2A and FIG. 2B, a circuit board 200 having altogether patterned circuit layers and dielectric layers is used as an example in FIG. 2A. The circuit board 200 has a multi-layer circuit structure 210 comprising a top circuit structure 220, a dielectric core layer 230 and a bottom circuit structure 240. The top circuit structure 220 comprises a plurality of patterned circuit layers and at least a dielectric layer alternately laminated over each other above the dielectric core layer 230. Similarly, the bottom circuit structure 240 comprises a plurality of patterned circuit layers and at least a dielectric layer alternately laminated over each other below the dielectric core layer 230.

Further, the dielectric core layer 230 has a pair of through holes 232 and 236, passing through the dielectric core layer 230 and linking a top surface 230a with a bottom surface 230b of the dielectric core layer 230. A signal line 234a and a reference line 234b are disposed on a portion of an inner surface of the through hole 232 of the dielectric core layer 230 and are extended through the through hole 232 of the dielectric core layer 230 to electrically connect the top circuit structure 220 with the bottom circuit structure 240. Similarly, a signal line 238a and a reference line 238b covers a portion of an inner surface of the through hole 236 of the dielectric core layer 230 and extended through the dielectric core layer 230 to electrically connect the top circuit structure 220 with the bottom circuit structure 240. The reference lines 234b and 238b can be a ground line and a power line. The signal lines 234a and 238a can be utilized for transmitting the differential signal.

Referring to FIG. 2A, it should be noted that the reference lines 234b and 238b are disposed on two opposite insides of the pair of through holes 232 and 236, while the signal lines 234a and 238a are disposed on two opposite outsides of the pair of through holes 232 and 236. Furthermore, the reference lines 234b and 238b are disposed between the signal lines 234a and 238a to separate the signal lines 234a and 238a. The effective distance between the signals passed through the signal lines 234a and 238a has become farther. Thus, when the signals are passed through the signal lines 234a and 238a, the alternate capacitance and inductance derived from the electromagnetic coupling between signals will be reduced, so as to lower the cross-talk problem and to promote the signal-transmission quality.

Figure 2C:
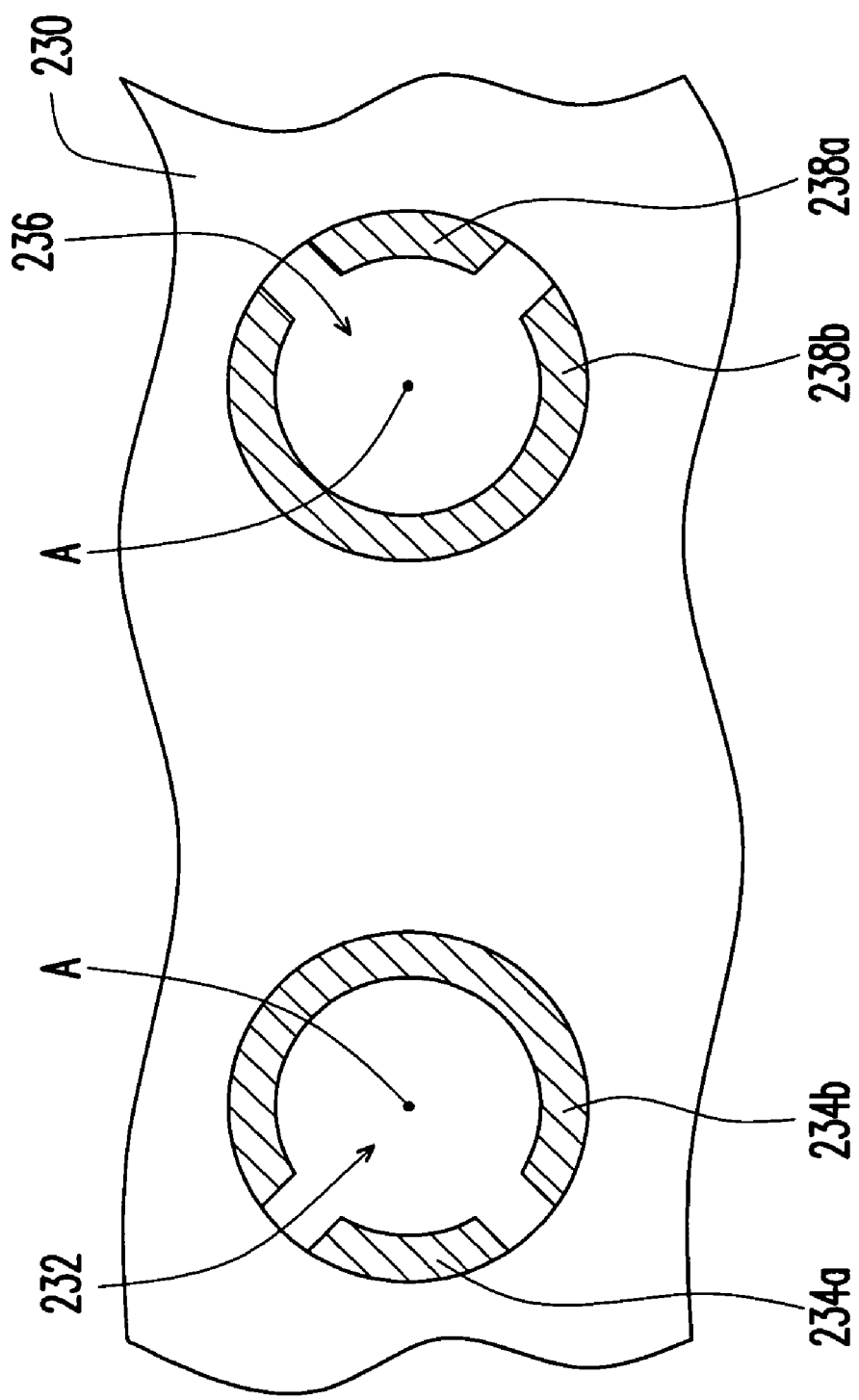
FIG. 2C is a horizontal cross-sectional view of a multi-conducting through hole structure according to another embodiment of the present invention.

FIG. 2C is a horizontal cross-sectional view of a multi-conducting through hole structure according to another embodiment of the present invention. Referring to FIG. 2C, comparing a multi-conducting through hole structure according to another embodiment of the present invention in FIG. 2C to the same in FIG. 2B, the signal lines 234a and 238a and the reference signal 238a and 238b may have the arc-shape cross-sections, especially the outlines of the lines 234b and 238b is like C-shape. In other words, the width of the reference lines 234b and 238b can be larger than the width of the signal line 234a and 238a, such that the shielding effect of the reference lines 234b can be better.

To sum up, because the present invention, a multi-conducting through hole structure, has the structure that signal lines are separated by the reference lines whatever in one through hole or more through holes. It has the following advantages.

First, the electromagnetic coupling generated by signals can be reduced by utilizing the present invention while the signals are passing through one through hole or a plurality of through holes, and then the alternate capacitance and inductance derived from the electromagnetic coupling between the signals will also be decreased.

Second, the cross-talk interference between the signals passing through one through hole or a plurality of through holes can be diminished.

Third, the present invention can be applied in big-sized printed circuit boards and package substrate for signal transmission.

The above description provides a full and complete description of the embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A multi-conducting through hole structure, comprising:
   a substrate, having a first through hole and a second through hole those pass through the substrate;
   a first signal line, disposed on a portion of inner surface of the first through hole and extended through the first through hole;
   a second signal line, disposed on a portion of inner surface of the second through hole and extended through the second through hole; and
   a first reference line, disposed on a portion of the inner surface of the first through hole and extended through the first through hole, wherein the first reference line is disposed between the first signal line and the second signal line, and the width of the first reference line is larger than the width of the first signal line.

2. The multi-conducting through hole structure of claim 1, wherein the first reference line is a ground line or a power line.

3. The multi-conducting through hole structure of claim 1, wherein the first signal line and the first reference line are arranged around a central axis of the first through hole.

4. The multi-conducting through hole structure of claim 1, wherein the width of the first reference line is larger than the width of the second signal line.

5. The multi-conducting through hole structure of claim 1, further comprising a second reference line, disposed on a portion, of the inner surface of the second through hole and extended through the second through hole, wherein the second reference line is disposed between the first signal line and the second signal line.

6. The multi-conducting through hole structure of claim 5, wherein the second reference line is a ground line or a power line.

7. The multi-conducting through hole structure of claim 5, wherein the second signal line and the second reference line are arranged around a central axis of the second through hole.

8. The multi-conducting through hole structure of claim 5, wherein the width of the second reference line is larger than the width of the second signal line.

9. The multi-conducting through hole structure of claim 5, wherein the width of the second reference line is larger than the width of the first signal line.

* * * * *